United States Patent

Kim et al.

[11] Patent Number: 5,139,913
[45] Date of Patent: Aug. 18, 1992

[54] PHOTOSENSOR HAVING A MONOMOLECULAR MEMBRANES OF SQUARYLIUM PIGMENT

[75] Inventors: Suk Kim; Makoto Furuki; Lyong S. Pu, all of Kanagawa, Japan

[73] Assignee: Fuji Xerox Co., Ltd., Tokyo, Japan

[21] Appl. No.: 526,526

[22] Filed: May 21, 1990

Related U.S. Application Data

[63] Continuation of Ser. No. 333,948, Apr. 6, 1989, abandoned.

[30] Foreign Application Priority Data

Apr. 8, 1988 [JP] Japan .................. 63-85221

[51] Int. Cl.$^5$ .................. G03G 5/06; B05D 1/18
[52] U.S. Cl. .................. 430/73; 430/74; 430/129; 428/333
[58] Field of Search .................. 430/73, 76, 56, 57, 430/74, 129; 428/333

[56] References Cited

U.S. PATENT DOCUMENTS 4,584,235 4/1986 Roberts et al. .................. 428/333
4,592,980 6/1986 Tomida et al. .................. 430/57
4,700,001 10/1987 Tanaka et al. .................. 430/73

FOREIGN PATENT DOCUMENTS 52-55643 5/1977 Japan .

*Primary Examiner*—John Goodrow
*Attorney, Agent, or Firm*—Finnegan, Henderson, Farabow, Garrett and Dunner

[57] ABSTRACT

A photosensor having a photoconductive layer made of built-up monomelecular membranes containing a squarylium pigment represented by the formula (I):

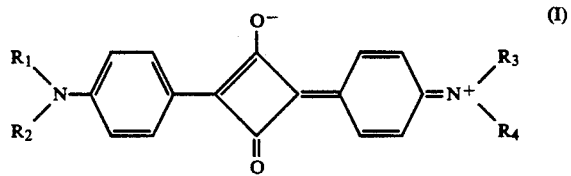

wherein $R_1$, $R_2$, $R_3$ and $R_4$, which may be the same or different, each represents an alkyl group.

11 Claims, 2 Drawing Sheets

PHOTOSENSOR HAVING A MONOMOLECULAR MEMBRANES OF SQUARYLIUM PIGMENT

This application is a continuation of application Ser. No. 07/333,948, filed Apr. 6, 1989 now abandoned.

FIELD OF THE INVENTION

The present invention relates to a photosensor, and more particularly, to a photosensor having a photoconductive layer that is made of built-up monomolecular membranes containing a squarylium pigment.

BACKGROUND OF THE INVENTION

Various types of photosensors have been proposed and are known, including: those which employ inorganic materials such as CdS, CdSe and amorphous Si, those which have organic pigments dispersed in binder resins, and those which have organic pigments formed in layers by vacuum evaporation, spin coating or various other techniques.

Photosensors that employ inorganic materials have not been considered to be suitable for use over large areas of the meter order because the film forming methods that can be adopted for this purpose are limited. Photosensors that have organic pigments dispersed in binder resins are advantageous for use over large areas but commercially acceptable high optical response speeds have not yet been attained. Photosensors that have organic pigments formed in layers by vacuum evaporation, spin coating or various other known techniques have problems in connection with the control of molecular arrangement in the film or with its thickness.

SUMMARY OF THE INVENTION

The present invention has been accomplished in order to solve the aforementioned problems of the prior art and an object thereof is to provide a photosensor that features high sensitivity, high S/N ratio (i.e., the ratio of light current to dark current) and fast optical response and which is still suitable for use over a large area.

This object of the present invention can be attained by a photosensor that comprises electrodes and a photoconductive layer which is made of built-up monomolecular membranes containing a squarylium pigment represented by the following general formula (I):

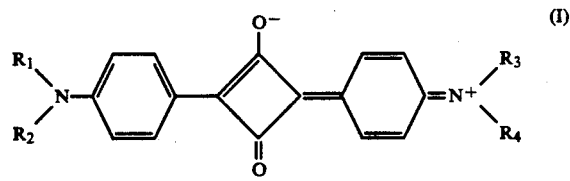

wherein $R_1$, $R_2$, $R_3$ and $R_4$, which may be the same or different, each represents an alkyl group.

DETAILED DESCRIPTION OF THE INVENTION

The term "built-up monomolecular membranes" as used herein means a laminar structure in which molecules are arranged in a regular order.

Figure 1:
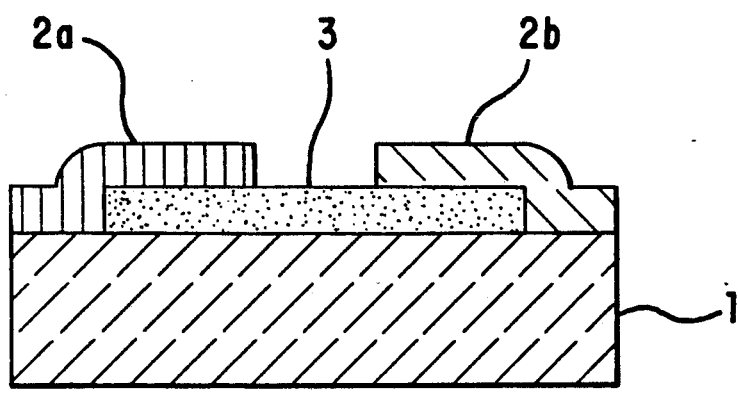
FIG. 1 is a cross section of a photosensor according to one embodiment of the present invention.
Figure 2:
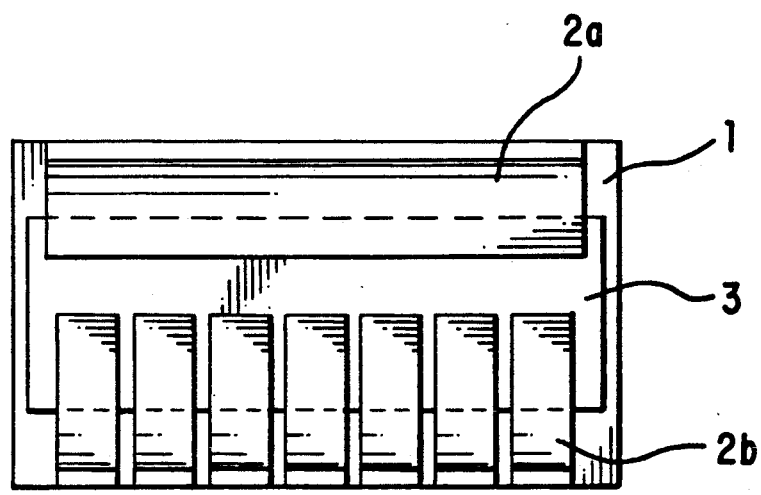
FIG. 2 is a plan view of the photosensor shown in FIG. 1.
Figure 3:
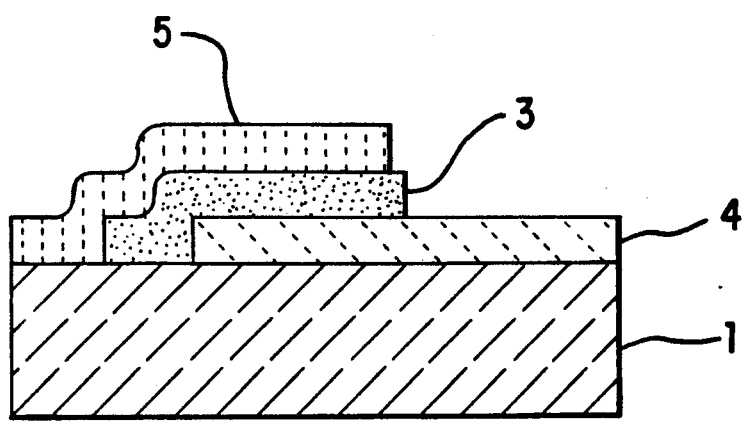
FIG. 3 is a cross section of a photosensor according to another embodiment of the present invention.
Figure 4:
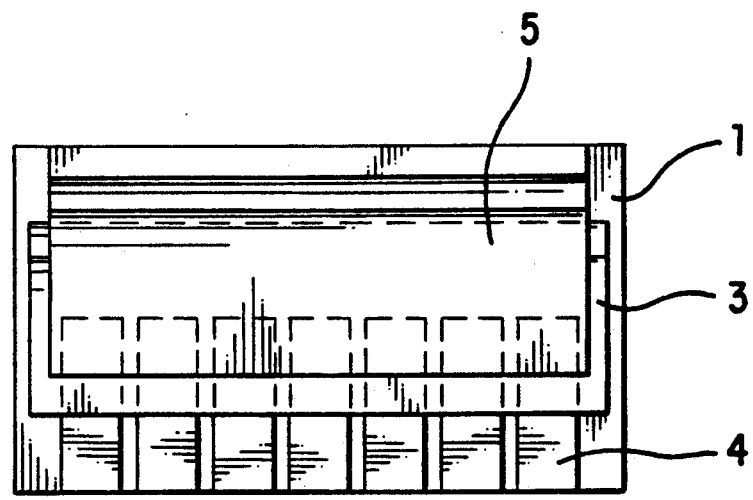
FIG. 4 is a plan view of the photosensor shown in FIG. 3

Two examples of the photosensor of the present invention are described hereinafter with reference to the accompanying drawings. FIG. 1 is a cross section of a photosensor having a planar structure, and FIG. 2 is a plan view of this photosensor. FIG. 3 is a cross section of a photosensor having a sandwich structure, and FIG. 4 is a plan view of this photosensor.

As clearly shown in FIG. 1, the photosensor having a planar structure comprises a substrate 1 having a photoconductive layer 3 formed thereon, which is overlaid with electrodes 2a and 2b spaced on opposite sides, e.g. on opposite sides of substrate 1. As shown specifically in FIG. 3, the photosensor having a sandwich structure comprises a substrate 1 having a lower electrode 4 formed thereon, which is successively overlaid with a photoconductive layer 3 and an upper electrode 5.

With either type of structure, the photosensor of the present invention may have additional layers formed on the photoconductive layer, such as a protective layer of an inorganic compound (e.g., SiN, $SiO_2$, etc.) or an organic compound (e.g., polyimide resins) (not shown) which protects the photoconductive layer from the environment and external forces, or a light blocking layer of polyimide resins (not shown) which provides isolation between bits. If desired, a layer e.g., an n, n+, i, p or p+ type hydrogenated amorphous silicon layer (also not shown) for providing improved electrical properties may be interposed between the photoconductive layer and each electrode.

A suitable substrate may be selected from glass, plastics, ceramics and combinations thereof.

Electrodes may be formed of various materials including those selected from among Al, Ti, Au, Ag, Cr, Mn, Fe, Co, Ni, Cu, Zn, Pb, Sn, Mo, W are alloys thereof. Transparent electrodes such as NESA or ITO (which are glass plates having coated thereon a thin layer of tin oxide or indium-tin oxide, respectively) can also be used. To make electrodes, these electroconductive materials are deposited as a film by suitable methods including evaporation, sputtering and chemical vapor deposition (CVD). In order to obtain electrodes of desired shapes, masked evaporation, photoetching, screen printing or lift-off techniques can be employed.

The photoconductor layer in the photosensor of the present invention is made of built up monomolecular membranes containing a squarylium pigment represented by the general formula (I) set forth herein. It is preferred that the alkyl group for $R_1$, $R_2$, $R_3$ and $R_4$ contain from 1 to 18 carbon atoms. Illustrative squarylium pigments can be used are listed below.

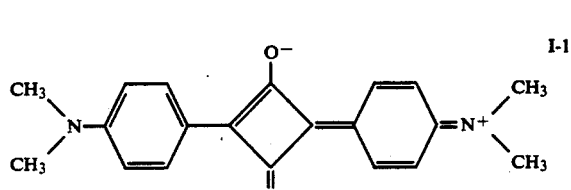

-continued
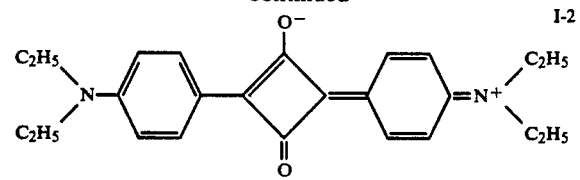 I-2
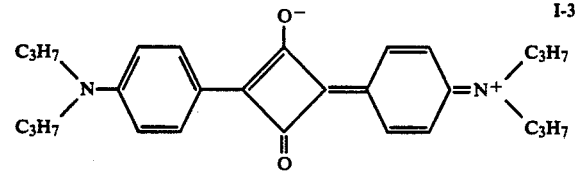 I-3
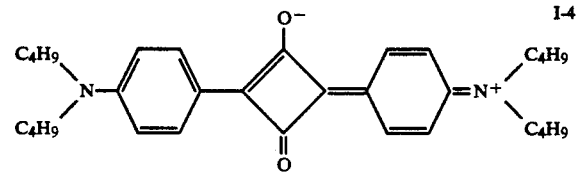 I-4
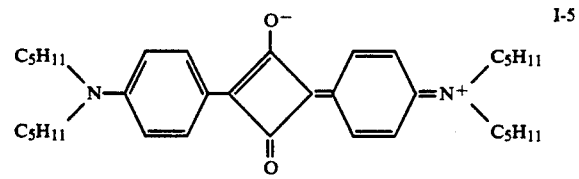 I-5
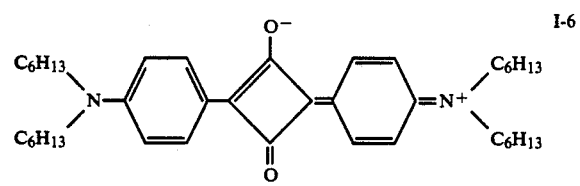 I-6
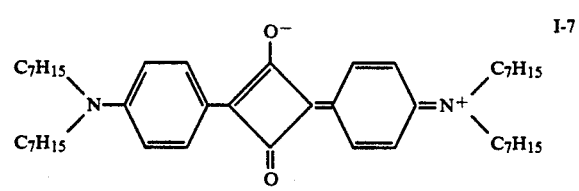 I-7
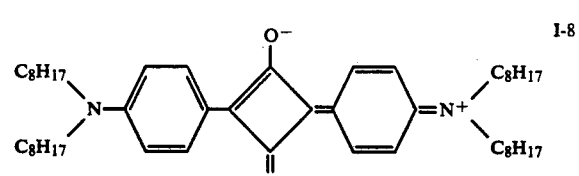 I-8
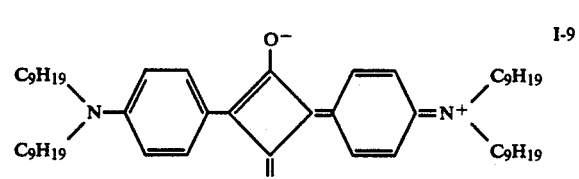 I-9
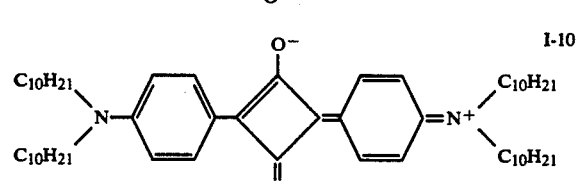 I-10
-continued
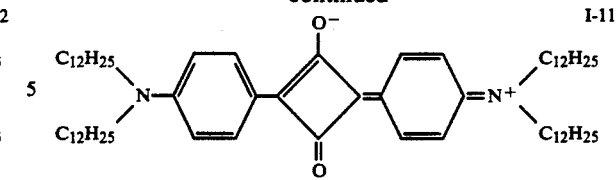 I-11
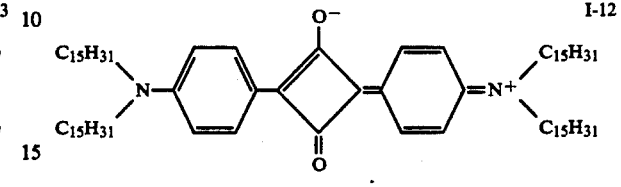 I-12
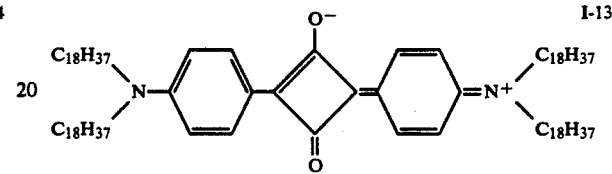 I-13
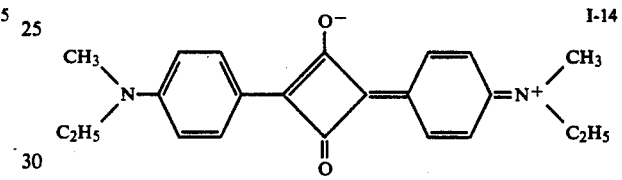 I-14
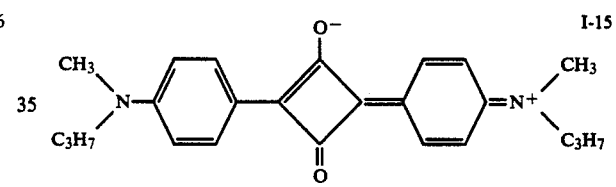 I-15
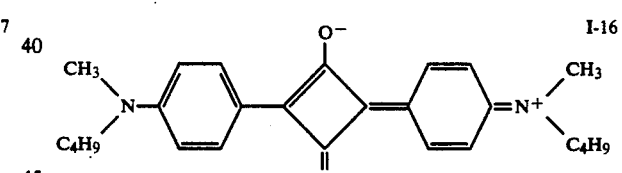 I-16
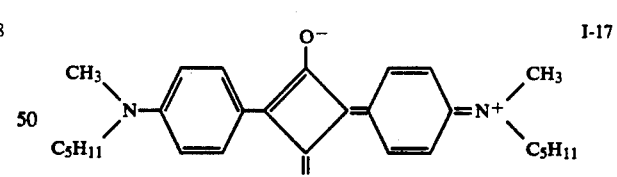 I-17
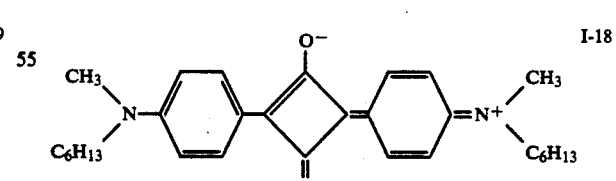 I-18
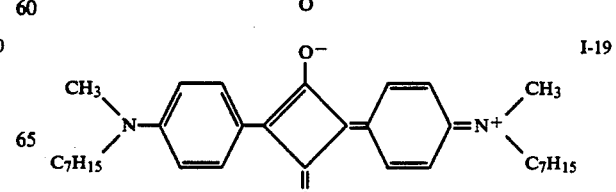 I-19

-continued
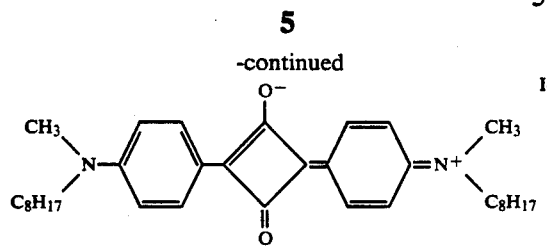 I-20
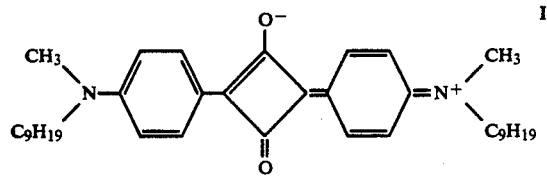 I-21
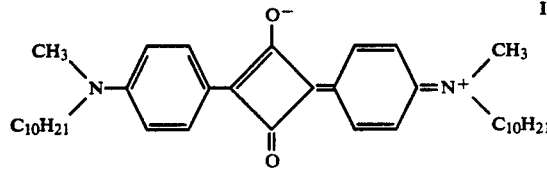 I-22
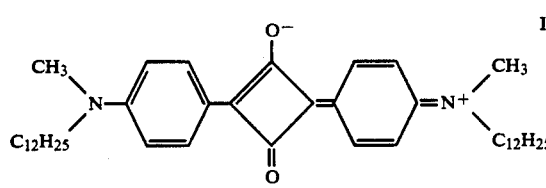 I-23
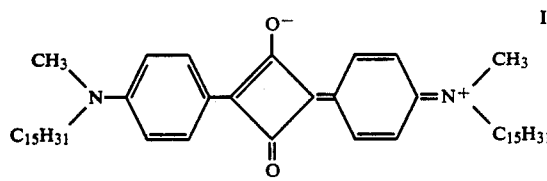 I-24
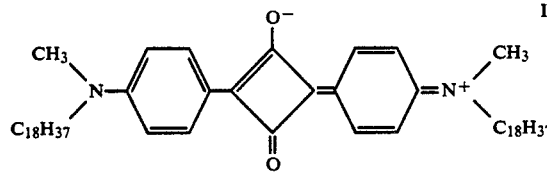 I-25
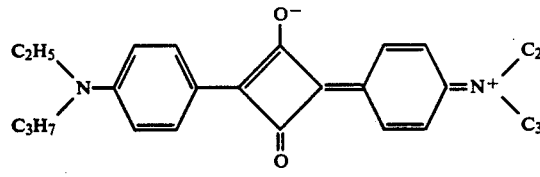 I-26
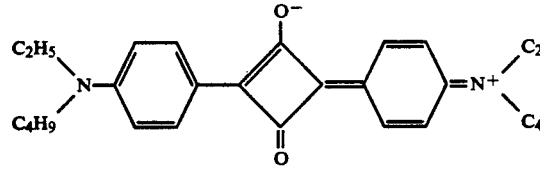 I-27
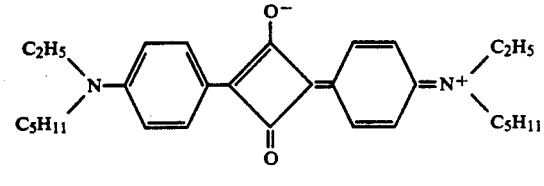 I-28
-continued
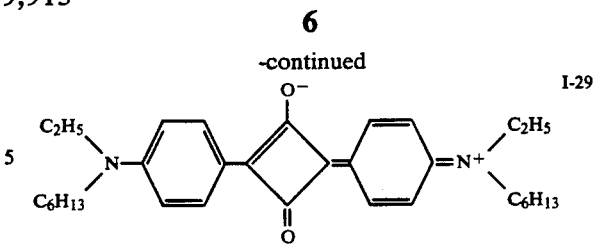 I-29
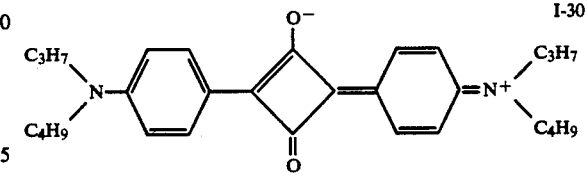 I-30
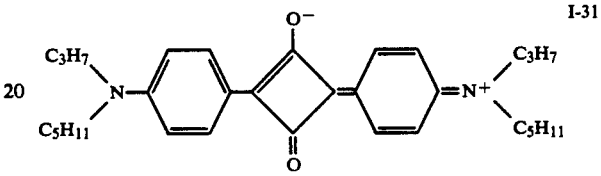 I-31
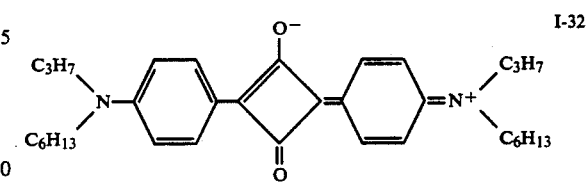 I-32
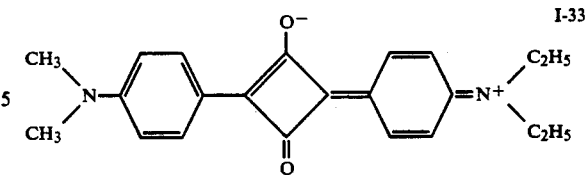 I-33
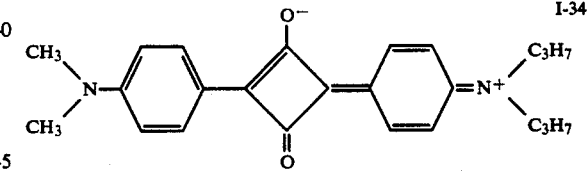 I-34
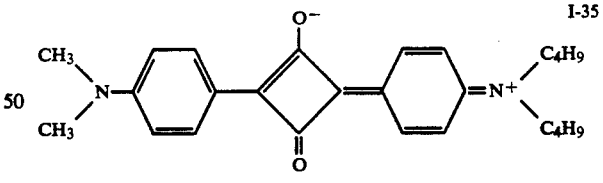 I-35
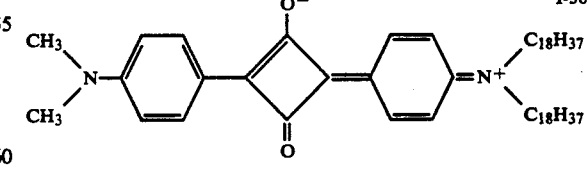 I-36
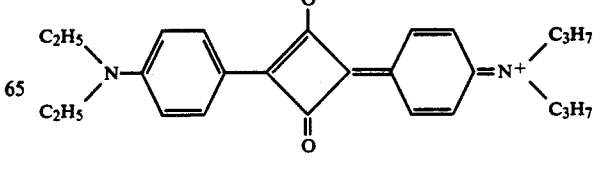 I-37

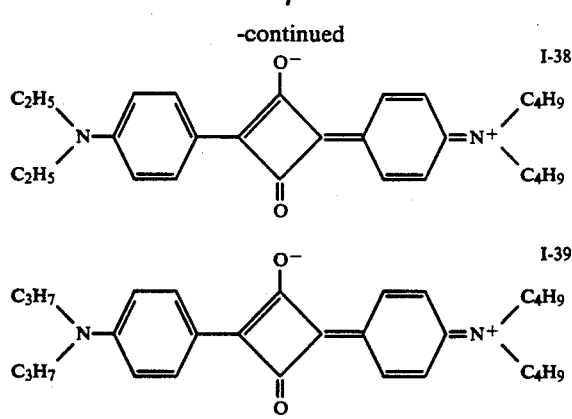

These squarylium pigments used in the present invention can be produced by a conventional manner as described, for example, in JP-A-52-55643. (The term "JP-A" herein used means "an unexamined published Japanese patent application".)

The built-up monomolecular membranes of which the photoconductive layer is made may be a mixed type which contains more than one kind of the squarylium pigment of the present invention. They may contain film-forming materials other than the squarylium pigment of the present invention. Alternatively, dissimilar monomolecular membranes may be superposed to form a hetero membrane made of different kinds of the squarylium pigments or of the squarylium pigments and other film-forming materials. In either case, the built-up monomolecular membranes contains from 1 to 100 mol %, preferably from 30 to 100 mol %, of the squarylium pigments of the present invention. Examples of film-forming materials other than the squarylium pigments include long chain saturated aliphatic acids such as stearic acid and arachic acid, and derivatives thereof; saturated aliphatic hydrocarbons such as hexadecane and octadecane; and long chain unsaturated aliphatic acids such as ω-tricosenoic acid, α-octadecylacrylic acid, 10,12-pentacosadiinoic acid and 10,12-tricosadiinoic acid, and derivatives thereof.

The built-up monomolecular membranes suitable for use in the present invention may be formed by the Langmuir-Blodgett method (hereinafter abbreviated as the LB method) as described in Shin Jikken Kagaku Koza, Vol. 18, pp. 498-507, published by Maruzen (October, 1977). In this method, a solution having a film forming material dissolved in a solvent is first spread over the surface of water and the solvent is completely evaporated; thereafter, the water surface is compressed until a predetermined surface pressure is attained; after forming a monomolecular membrane in this way, a substrate is dipped into the water through the membrane and moved up and down in a vertical direction so as to build up a desired number of monomolecular membranes. This method is advantageous for the purpose of fabricating a photosensor of a large area.

Other methods that can be used to form built-up monomolecular membranes include: a horizontal deposition technique in which a substrate is brought into contact with a monomolecular membrane and held horizontally while a plurality of the membranes are transferred onto it, and a rotational method in which a cylinder or a prism is brought into contact with a monomolecular membrane on the surface of the water and is rotated with its axis held horizontally so as to have a plurality of the membranes transferred successively onto the surface of the solid.

The formation of built-up monomolecular membranes by the LB method is described below more specifically with particular reference being made to the present invention. A squarylium pigment and, if necessary, other film-forming materials are dissolved in an organic solvent (e.g. chloroform or benzene) and the solution is spread over the surface of water at a range from about 5° to about 30° C.; after evaporating the solvent completely, the water surface is compressed until a predetermined surface pressure is attained so as to form a monomolecular membrane. The surface pressure, which depends on various factors including the type of pigment, the temperature and pH of the aqueous phase, is generally adjusted to be within the range of 5 to 50 mN/m, preferably 10 to 30 mN/m. With the surface pressure maintained within this range, a substrate dipped into the water through the monomolecular membrane is moved up and down in a vertical direction so as to build up desired number of monomolecular membranes on the substrate.

A photoconductive layer made up of these built-up monomolecular membranes has a thickness which is adjusted generally to be within the range of 0.05 to 5 μm, preferably 0.1 to 2 μm.

The monomolecular membranes thus built up in accordance with the present invention which contain a squarylium pigment of the general formula (I) have molecules arranged in a regular order. Therefore, a photoconductive layer made of these built-up monomolecular layers features (1) an increased extinction coefficient and quantum efficiency, (2) an increased carrier mobility, and (3) improved uniformity in film thickness. These features combine to contribute desired characteristics to the photosensor of the present invention, such as high sensitivity, high S/N ratio and fast response.

The following examples are provided for the purpose of further illustrating the present invention but are in no way to be taken as limiting.

EXAMPLE 1

A squarylium pigment (compound I-2) was dissolved in chloroform at the concentration of $10^{-14}$ mol/l and the resulting solution was spread over the surface of water at 10° C. After evaporating chloroform, the water surface was compressed until a surface pressure of 15 mN/m was attained so as to form a monomolecular membrane. Subsequently, a glass substrate was dipped into the water through the membrane and cyclically moved up and down in a vertical direction at a rate of 5 mm/min until monomolecular membranes built up to a thickness of about 1500 Å. Thereafter, gold was evaporated onto the built-up membrane to form electrodes spaced 10 μm apart so as to fabricate a photosensor of the planar type shown in FIG. 1.

A direct current voltage was applied to this photosensor to produce a field strength of $1 \times 10^5$ volts/cm and its S/N ratio (i.e., the ratio of light current to dark current) and optical response speed (i.e., rise time and fall time) were determined. The radiation intensity was 100 lux from a tungsten lamp. The results are shown in Table 1.

EXAMPLES 2 TO 10

Additional photosensors were fabricated as in Example 1 except that compound I-2 was replaced by the squarylium pigment identified in Table 1. These photosensors were subjected to the same test as that conducted in Example 1. The results are summarized in Table 1.

TABLE 1

| Example No. | Squarylium pigment | Light current (A) | Dark current (A) | S/N ratio | Rise time (msec) | Fall time (msec) |
|---|---|---|---|---|---|---|
| 1 | I-2 | $6.2 \times 10^{-6}$ | $8.0 \times 10^{-10}$ | $7.8 \times 10^3$ | 26 | 18 |
| 2 | I-3 | $4.6 \times 10^{-6}$ | $6.2 \times 10^{-10}$ | $7.4 \times 10^3$ | 30 | 23 |
| 3 | I-4 | $3.2 \times 10^{-6}$ | $6.3 \times 10^{-10}$ | $5.1 \times 10^3$ | 34 | 27 |
| 4 | I-1 | $5.7 \times 10^{-6}$ | $8.5 \times 10^{-10}$ | $6.7 \times 10^3$ | 23 | 13 |
| 5 | I-15 | $5.3 \times 10^{-6}$ | $8.2 \times 10^{-10}$ | $6.5 \times 10^3$ | 25 | 19 |
| 6 | I-16 | $3.8 \times 10^{-6}$ | $7.4 \times 10^{-10}$ | $5.1 \times 10^3$ | 27 | 22 |
| 7 | I-25 | $1.4 \times 10^{-6}$ | $4.8 \times 10^{-10}$ | $2.9 \times 10^3$ | 39 | 31 |
| 8 | I-26 | $5.1 \times 10^{-6}$ | $7.6 \times 10^{-10}$ | $6.7 \times 10^3$ | 28 | 23 |
| 9 | I-27 | $2.1 \times 10^{-6}$ | $6.0 \times 10^{-10}$ | $3.5 \times 10^3$ | 31 | 25 |
| 10 | I-34 | $3.9 \times 10^{-6}$ | $8.1 \times 10^{-10}$ | $4.8 \times 10^3$ | 27 | 20 |

COMPARATIVE EXAMPLES 1 TO 5

Photosensors were fabricated as in Examples 1, 2, 3, 8 and 10 except that the photoconductive layers were replaced by membranes having squarylium pigments dispersed in a binder resin. These membranes serving as photoconductive layers were prepared by the following method: 1 part by weight of a squarylium pigment (for its name, see Table 2 below) was mixed with 1 part by weight a polyester resin and the resulting mixture was added to methylene chloride, followed by vigorous stirring to form a fine dispersion; this dispersion was dip-coated on a glass substrate to form a photoconductive layer having a thickness of about 1500 Å.

The photosensors thus fabricated were subjected to the same test as that conducted in Example 1, and the results are summarized in Table 2.

TABLE 2

| Comparative Example No. | Squarylium pigment | Light current (A) | Dark current (A) | S/N ratio | Rise time (msec) | Fall time (msec) |
|---|---|---|---|---|---|---|
| 1 | I-2 | $1.4 \times 10^{-7}$ | $4.3 \times 10^{-10}$ | $3.3 \times 10^2$ | 208 | 184 |
| 2 | I-3 | $5.2 \times 10^{-8}$ | $9.4 \times 10^{-11}$ | $5.5 \times 10^2$ | 253 | 227 |
| 3 | I-4 | $4.7 \times 10^{-8}$ | $9.1 \times 10^{-11}$ | $5.2 \times 10^2$ | 270 | 238 |
| 4 | I-26 | $8.3 \times 10^{-8}$ | $2.1 \times 10^{-10}$ | $4.0 \times 10^2$ | 224 | 198 |
| 5 | I-34 | $8.1 \times 10^{-8}$ | $3.0 \times 10^{-10}$ | $2.7 \times 10^2$ | 229 | 195 |

A comparison of the data giver in Table 1 with that in Table 2 shows that the photosensor of the present invention which has a photoconductive layer made of built-up monomolecular membranes containing a squarylium pigment of the formula (I) set forth herein has a high sensitivity, high S/N ratio (i.e., the ratio of light current to dark current) and fast optical response speed. In addition, this photosensor is suitable for use over a large area.

While the invention has been described in detail and with reference to specific embodiments thereof, it will be apparent to one skilled in the art that various changes and modifications can be made therein without departing from the spirit and scope thereof.

What is claimed is:

1. A photosensor having a photoconductive layer comprising built-up monomolecular membranes which contain a squarylium pigment represented by the formula (I):

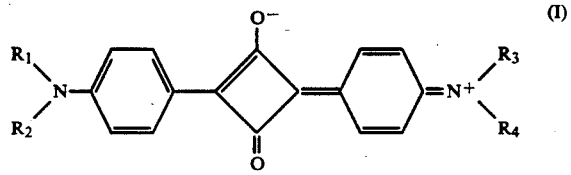

wherein $R_1$, $R_2$, $R_3$ and $R_4$, which may be the same or different, each represents an alkyl group.

2. A photosensor according to claim 1, wherein said photoconductive layer is formed on a substrate and partly overlaid with electrodes.

3. A photosensor according to claim 1, wherein a substrate is successively overlaid with a lower electrode, said photoconductive layer and an upper electrode.

4. A photosensor according to claim 1, wherein said alkyl group contains from 1 to 18 carbon atoms.

5. A photosensor according to claim 1, wherein said photoconductive layer has a thickness in the range of about 0.05 to 5 μm.

6. A photosensor according to claim 1, wherein said photoconductive layer has a thickness in the range of about 0.1 to 2 μm.

7. The photosensor of claim 1, wherein said photosensor has a planar structure.

8. The photosensor of claim 1, wherein said photosensor has a sandwich structure.

9. The photosensor of claim 1, wherein said membranes further comprise a material other than a squarylium pigment.

10. The photosensor of claim 9, wherein said material is a long-chain aliphatic acid or a saturated aliphatic hydrocarbon.

11. The photosensor of claim 1, wherein said membranes are formed by the Langmuir-Blodgett method.

* * * * *